United States Patent
Wang et al.

(10) Patent No.: US 9,036,407 B2
(45) Date of Patent: May 19, 2015

(54) VOLTAGE-CONTROLLED MAGNETIC MEMORY ELEMENT WITH CANTED MAGNETIZATION

(71) Applicant: THE REGENTS OF THE UNIVERSITY OF CALIFORNIA, Oakland, CA (US)

(72) Inventors: Kang L. Wang, Santa Monica, CA (US); Pedram Khalili Amiri, Los Angeles, CA (US); Juan G. Alzate, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/101,260

(22) Filed: Dec. 9, 2013

(65) Prior Publication Data

US 2014/0169085 A1    Jun. 19, 2014

Related U.S. Application Data

(60) Provisional application No. 61/734,922, filed on Dec. 7, 2012.

(51) Int. Cl.
| | | |
|---|---|---|
| G11C 11/00 | (2006.01) | |
| H01L 43/10 | (2006.01) | |
| G11C 11/16 | (2006.01) | |
| H01L 43/08 | (2006.01) | |
| H01L 27/22 | (2006.01) | |

(52) U.S. Cl.
CPC .............. *H01L 43/10* (2013.01); *G11C 11/161* (2013.01); *H01L 43/08* (2013.01); *H01L 27/228* (2013.01)

(58) Field of Classification Search
USPC .................. 365/158, 171, 173; 257/421, 422
See application file for complete search history.

(56) References Cited

U.S. PATENT DOCUMENTS 8,446,761 B2 * 5/2013 Apalkov et al. ............... 365/173

OTHER PUBLICATIONS

Shiota, et al., "Induction of coherent magnetization switching in a few atomic layers of FeCo using voltage pulses," Nat Mater vol. 11 (1), pp. 39 (Nov. 13, 2012).
Wang, et al., "Electric-field-assisted switching in magnetic tunnel junctions," Nat Mater vol. 11, pp. 64-68, (Nov. 13, 2011).

* cited by examiner

*Primary Examiner* — David Lam
(74) *Attorney, Agent, or Firm* — John P. O'Banion

(57) ABSTRACT

A memory cell including information that is stored in the state of a magnetic bit (i.e. in a free layer, FL), where the FL magnetization has two stable states that may be canted (form an angle) with respect to the horizontal and vertical directions of the device is presented. The FL magnetization may be switched between the two canted states by the application of a voltage (i.e. electric field), which modifies the perpendicular magnetic anisotropy of the free layer.

32 Claims, 13 Drawing Sheets

US 9,036,407 B2

VOLTAGE-CONTROLLED MAGNETIC MEMORY ELEMENT WITH CANTED MAGNETIZATION

CROSS-REFERENCE TO RELATED APPLICATIONS

This application is a nonprovisional of U.S. provisional patent application Ser. No. 61/734,922 filed on Dec. 7, 2012, incorporated herein by reference in its entirety.

INCORPORATION-BY-REFERENCE OF COMPUTER PROGRAM APPENDIX

Not Applicable

STATEMENT REGARDING FEDERALLY SPONSORED RESEARCH OR DEVELOPMENT

This invention was made with Government support under HR0011-10-C-0153 awarded by the U.S. Department of Defense, Defense Advanced Research Projects Agency. The Government has certain rights in this invention.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to magnetic tunnel junctions, and more particularly to electrical switching of magneto-electric tunnel junctions (MEJ's).

2. Description of Related Art

Spin-polarized currents have been widely used to manipulate and switch the magnetization in nanomagnets via the spin-transfer-torque (STT) effect, giving rise, for example, to STT-MRAM as an emerging memory technology. The use of currents, however, limits the energy efficiency of spintronic memory and logic devices. Thus, the use of electric fields to control magnetic properties may enable devices with significantly lower power consumption, thereby potentially resulting in a paradigm shift in spintronics expanding the range of applications of nonvolatile spintronic devices beyond memory, and enabling a new generation of ultralow-power nonvolatile systems.

BRIEF SUMMARY OF THE INVENTION

An aspect of the present invention is a magneto-electric tunnel junction that is electrically switchable via voltage-controlled magnetic anisotropy (VCMA) at a CoFeB—MgO interface, where the free layer has canted equilibrium states. The device allows for VCMA-induced switching between two canted states, without the influence of spin-polarized currents, with pulses down to the sub-1 ns regime. The device may also include a partially out-of-plane configuration that allows for selective precessional switching, or combining thermally-activated and precessional switching regimes, resulting in control of the switching direction at a fixed bias magnetic field or even without a bias magnetic field.

In one aspect, the perpendicular magnetic anisotropy at the interface of MgO and metallic magnetic films is modulated by a voltage applied across the MgO layer. This interfacial voltage-controlled magnetic anisotropy (VCMA) effect is of considerable practical value, given that it uses materials which offer high tunneling magnetoresistance (TMR) ratios, and are compatible with the fabrication processes used for conventional semiconductor electronics.

In another aspect, VCMA-driven manipulation and switching of voltage-controlled nanoscale MEJ devices is achieved via the competition between easy-plane shape anisotropy and interfacial perpendicular anisotropy (including higher order contributions) that results in canting of the equilibrium states of the free layer. This configuration, which enhances the tunability of the magnetization state of the free layer by the applied voltage, shows VCMA-induced, thermally-activated switching of the free layer with voltage pulses down to 10 ns, assisted by a small (few 10 Oe) in-plane external magnetic field applied to the device. Finally, by reducing the pulse duration to the sub-nanosecond regime, the presence of canted states allows for the elimination of the symmetry of VCMA-induced precessional switching, allowing for control of precessional switching direction by timing the write pulse.

In one aspect, a memory cell comprises information that is stored in the state of a magnetic bit (i.e. in a free layer, FL), wherein the FL magnetization has two stable states that may be canted (form an angle) with respect to the horizontal and vertical directions of the device. In one embodiment, the FL magnetization may be switched between the two canted states by the application of a voltage (i.e. electric field), which modifies the perpendicular magnetic anisotropy of the free layer.

In a preferred embodiment, the direction of switching is determined by either one or the combination of: (a) the magnitude of the applied voltage, and/or (b) the width of the voltage pulse applied to the device. I.e., switching between canted states is achieved by either one or a combination of: (a) setting the magnetization into a precessional motion upon application of a voltage pulse, with the pulse width timed such as to ensure switching to the opposite stable state (typical switching time<2 ns), and/or (b) setting the magnetization into a semi-stable state upon application of a voltage, by changing its energy barrier such as to make it less thermally stable, and then achieving switching through thermal activation (typical switching time>5 ns).

In one embodiment, the device has at least one additional dielectric layer DE in close proximity with the FL, and an additional pinned (fixed) magnetic layer PL separated from the FL by the DE layer.

In another embodiment, the PL may have a magnetization orientation that is in-plane or out-of-plane with respect to the sample plane.

In another embodiment, the relative orientation of the canted FL states with respect to the PL state results in two stable high and low resistance states HR and LR.

Another aspect is a Magneto-Electric (i.e. voltage-controlled) magnetic Random Access Memory (MERAM) bit as a device exhibiting tunneling magnetoresistance (TMR). This magnetic bit may be integrated with CMOS circuits to perform the write operation (applied voltage) and read operation (readout of the bit resistance). Controlling of the switching direction in MEJ devices is a key requirement for practical MERAM products. In the present invention, canted magnetization states along with differently timed voltage pulses are used to achieve switching in opposite directions (HR to LR and LR to HR).

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1A:
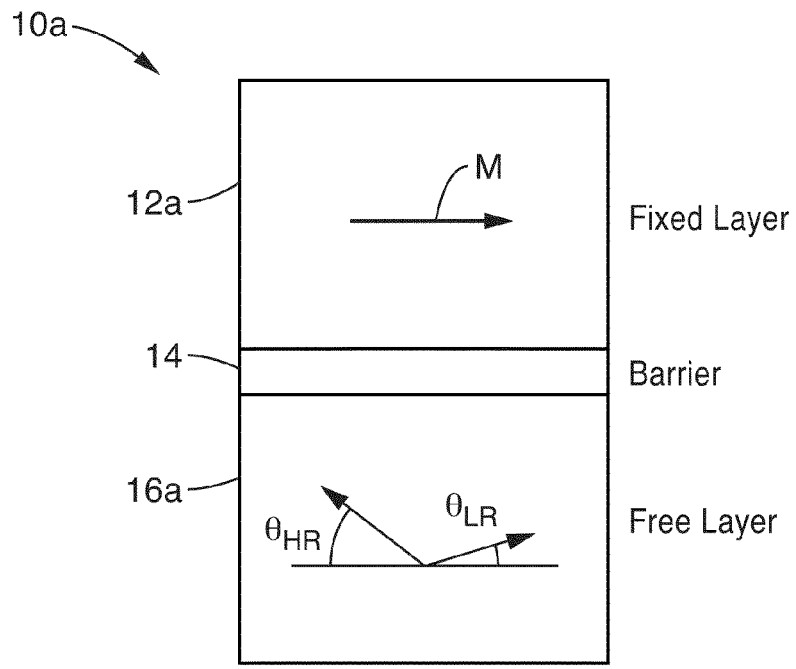
FIG. 1A and FIG. 1B show basic schematic diagrams (cross-sectional views) of memory bits in accordance with the present invention having tilted magnetization in the free layer, representing low and high-resistance states (LR and HR).
Figure 1B:
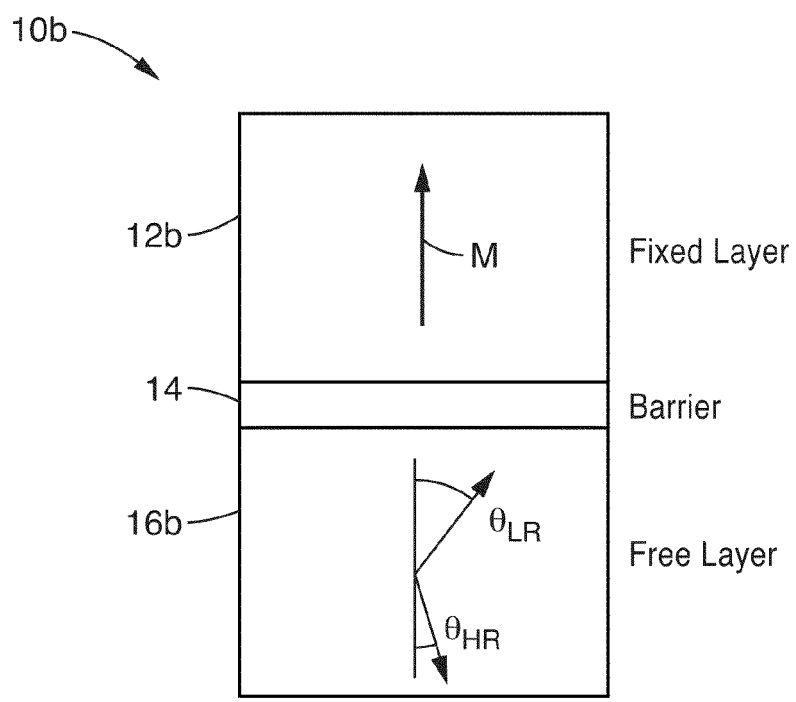

FIG. 1A and FIG. 1B show basic schematic diagrams (cross-sectional views) of memory bits in accordance with the present invention having tilted magnetization in the free layer, representing low and high-resistance states (LR and HR).

In FIG. 1A, a basic schematic diagram of memory bit 10a is shown having an in-plane fixed layer 12a (arrow M indicates the direction of magnetization in the layer) and tilted magnetization in the free layer 16a (i.e. the low and high-resistance states (LR and HR) are canted at angles $\Theta_{LR}$ and $\Theta_{HR}$ respectively with respect to magnetization direction M in the fixed layer 12a). Dielectric layer 14 separates fixed layer 12a and free layer 16a.

In FIG. 1B, a basic schematic diagram of memory bit 10b is shown having a perpendicular fixed layer 12b (arrow M being out of plane) and tilted magnetization in the free layer 16b (i.e. the low and high-resistance states (LR and HR) are canted at angles $\Theta_{LR}$ and $\Theta_{HR}$ respectively with respect to magnetization direction M in the fixed layer 12b). Dielectric layer 14 separates fixed layer 12b and free layer 16b.

Figure 2A:
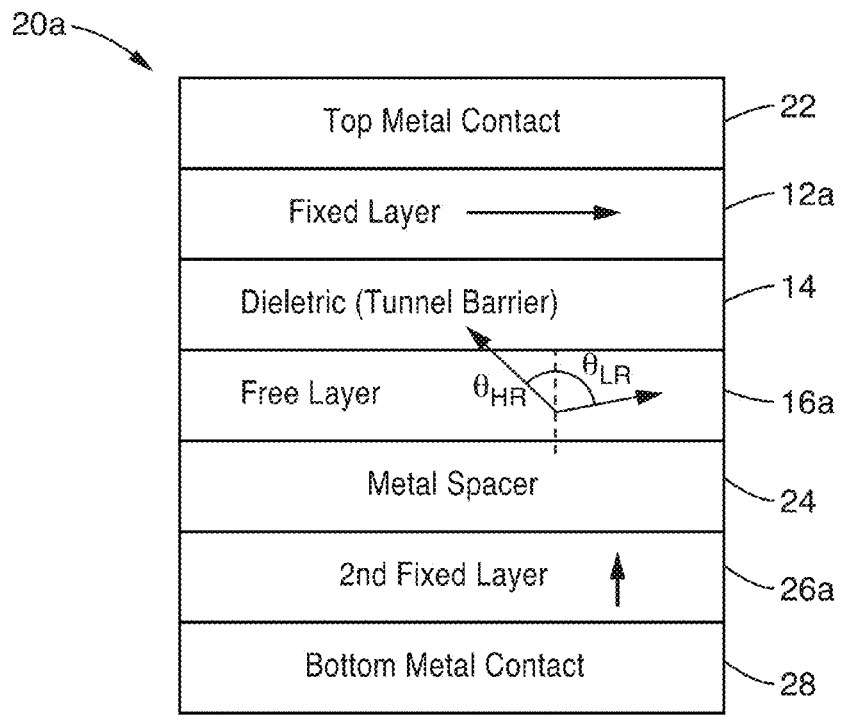
FIG. 2A and FIG. 2B show the memory bits of FIG. 1A and FIG. 1B respectively with additional fixed layers comprising in-plane and/or perpendicular magnetization directions used to realize an overall canted magnetic field acting on the free layer.
Figure 2B:
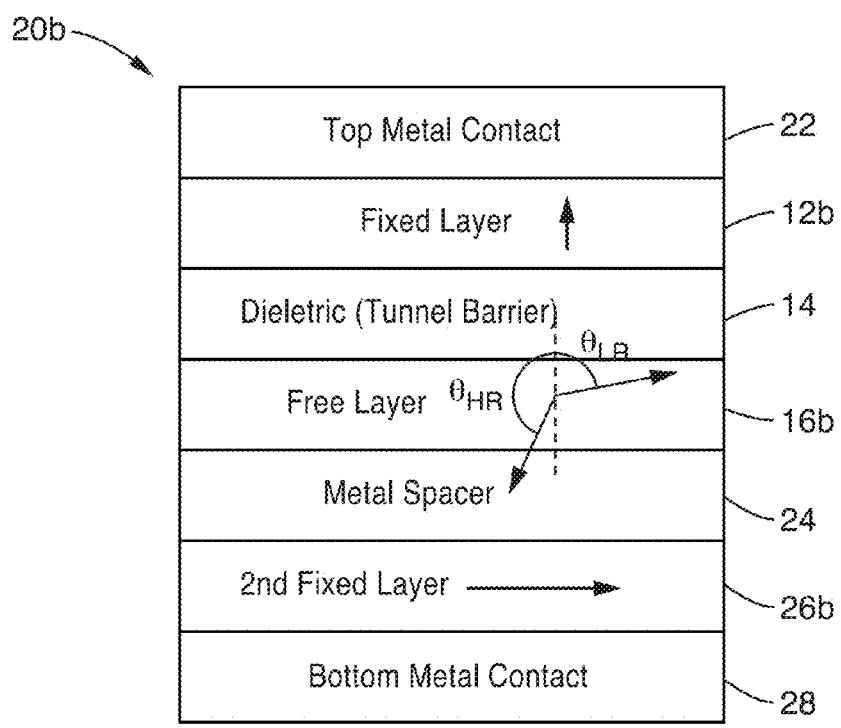

FIG. 2A and FIG. 2B show the memory bits of FIG. 1A and FIG. 1B respectively with additional fixed layers comprising in-plane and/or perpendicular magnetization directions used to realize an overall canted magnetic field acting on the free layer.

FIG. 2A shows a device 20a having a top metal contact 22 disposed over in-plane fixed layer 12a, and a metal spacer 24 disposed between canted free layer 16a and a second (perpendicular) fixed layer 26a. A bottom metal contact layer 28 is disposed under the second fixed layer 26a.

FIG. 2B shows a device 20b having a top metal contact 22 disposed over perpendicular fixed layer 12b, and a metal spacer 24 disposed between canted free layer 16b and a second (in-plane) fixed layer 26b. A bottom metal contact layer 28 is disposed under the second fixed layer 26b. In some configurations, the second fixed layer may also be exchange biased by placing it next to an antiferromagnetic layer, such as PtMn or IrMn.

It is appreciated that the canting angles and orientations $\Theta_{LR}$ and $\Theta_{HR}$ are shown in FIG. 1A through FIG. 2B are for illustration only and implementations of this invention are not limited to these particular angles.

Figure 3A:
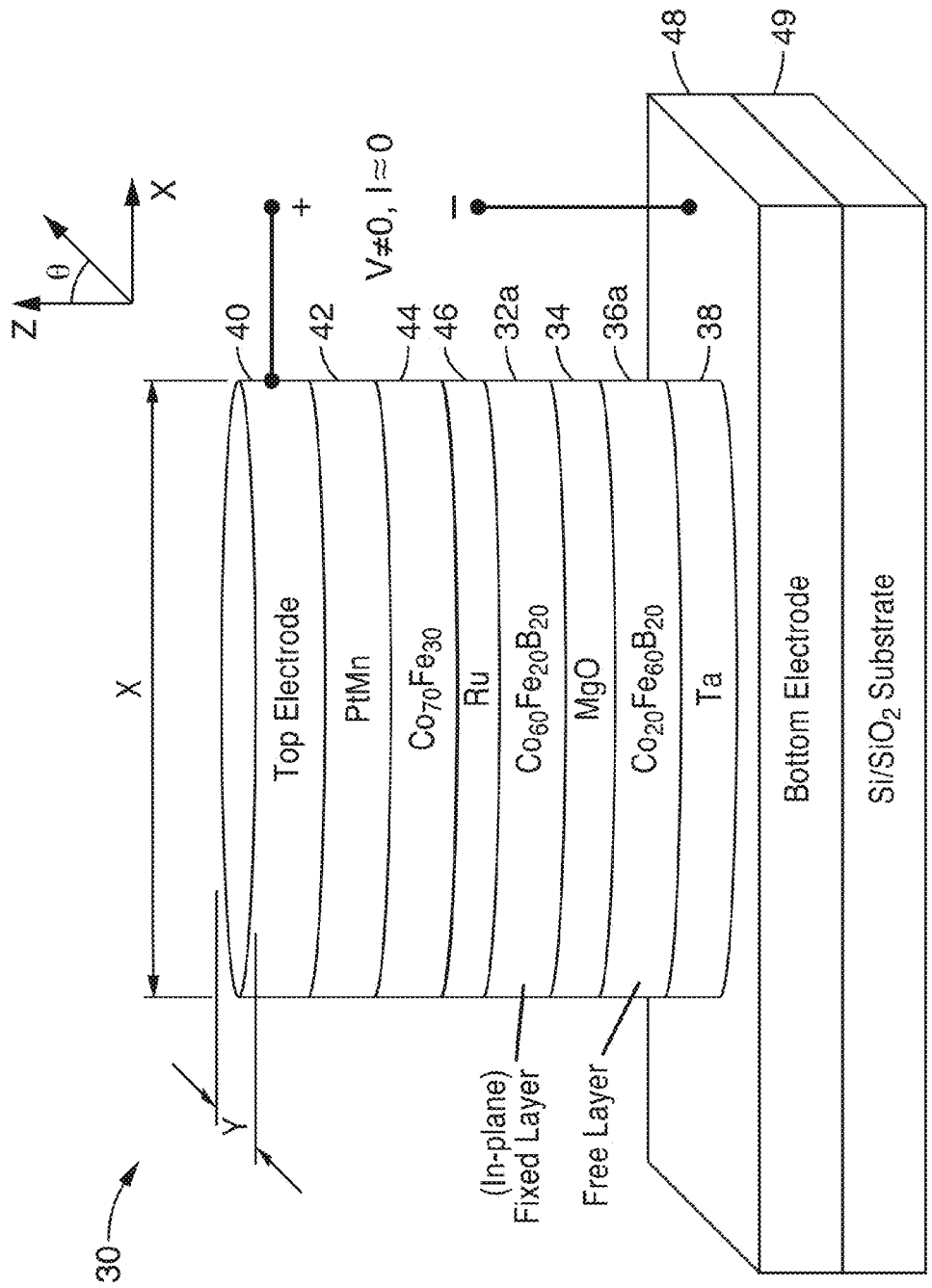
FIG. 3A shows a schematic cross section view of an exemplary device configuration having an in-plane fixed layer in accordance with the present invention.

FIG. 3A shows s schematic cross section view of an exemplary device configuration 30 having an in-plane fixed layer in accordance with the present invention. A dielectric tunnel barrier 34 (e.g. metal oxide such as MgO) is disposed between canted ferromagnetic (FM) free layer 36a (shown as $Co_{20}Fe_{60}B_{20}$, but may comprise variants of Fe, CoFe, CoFeB, TbFeCo, GdFeCo) and a ferromagnetic (in-plane) fixed layer 32a (shown as $Co_{60}Fe_{20}B_{20}$, but may comprise variants of Fe, CoFe, CoFeB, TbFeCo, GdFeCo, or multilayers containing two or more of the elements Pd, Pt, Co, Fe, CoFe, Ru and/or CoFeB). Free layer 36a may additionally contain a different material such as Pd, V, Hf, Gd, or Tb, either as doping, or inserted as a thin film (not shown) between the free layer and its adjacent layers. Additionally, this second material may be one with large spin-orbit coupling.

The fixed layer 32a may be exchange biased by an antiferromagnetic film 42 (e.g. PtMn as shown in FIG. 3A, or IrMn or the like). As shown in FIG. 3A, the fixed layer 32a may also be replaced by a synthetic antiferromagnet (SAF) structure such as a tri-layer (e.g. metallic (Ru) metallic coupling layer 46 separating a CoFe layer 44 and CoFeB layer 32a) where the Ru layer 46 thickness is chosen such as to provide antiferromagnetic interlayer exchange coupling.

Figure 3B:
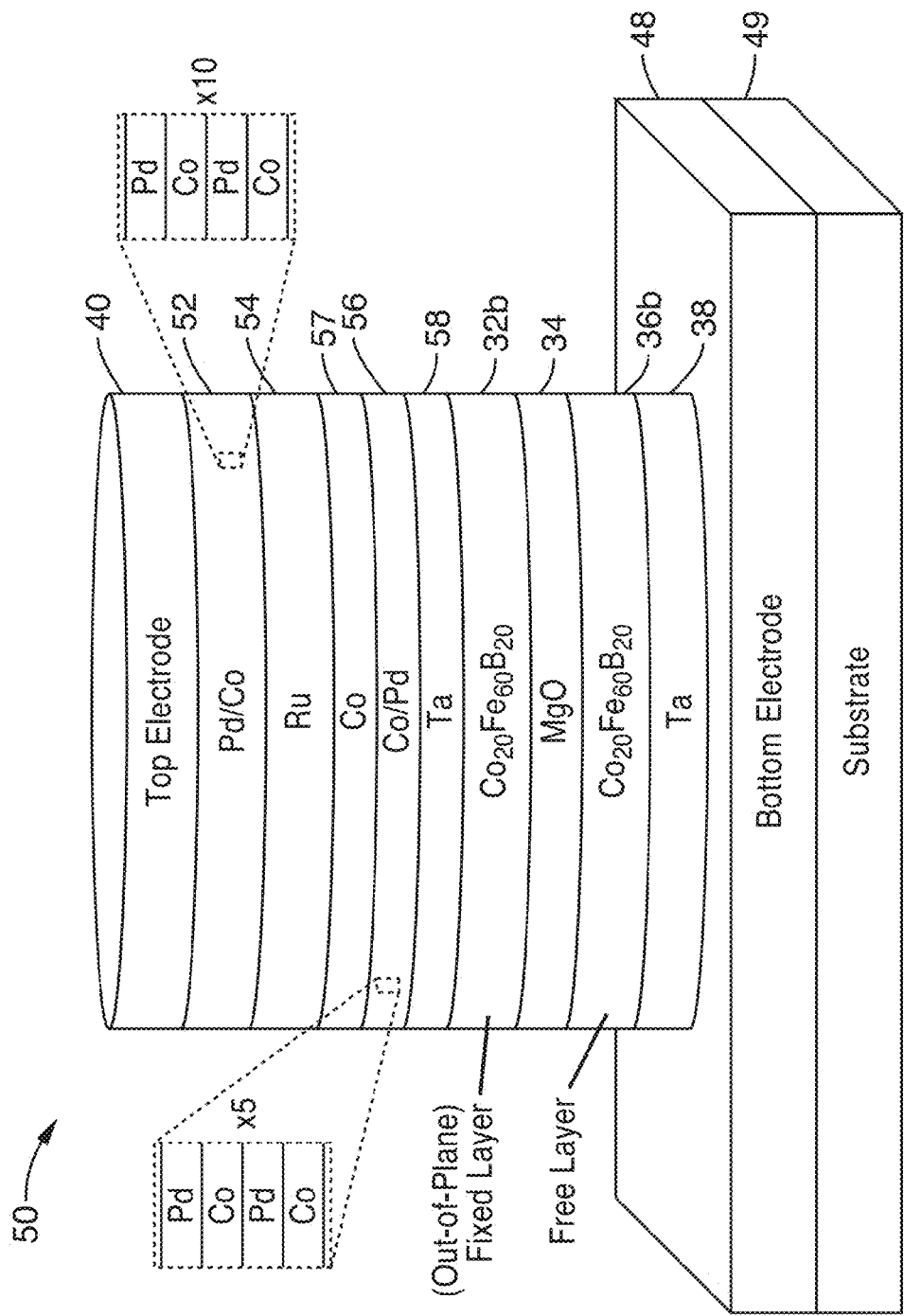
FIG. 3B shows a schematic cross section view of an exemplary device configuration having a perpendicular fixed layer in accordance with the present invention.

The free layer 36a may be capped (or seeded, depending on the deposition order of the films) by a metal layer 38 that helps promote a particular anisotropy (such as in-plane (FIG. 3A) or perpendicular (FIG. 3B magnetic anisotropy). Examples of materials that can be used as capping or seed layer 38 are Ta, Pt, Pd, Ru, etc.

In one embodiment, exemplary thickness for the layers of in-plane device 30 are as follows PtMn layer 42 (20 nm), Co70Fe30 layer 44 (2.3 nm), Ru layer (0.85 nm), fixed layer 32a (2.7 nm) and Ta layer 38 (5 nm). It is appreciated that these dimensions may be varied accordingly. Dielectric layer 34 and free layer 36a thickness are described in further detail below.

This capping or seed layer will thus also form part of the top or bottom electrodes 40/38 of the device 30. These electrodes 40/38 are used to apply voltages across the device. The electrodes 40/38 may be positioned on a silicon substrate 49. In another embodiment (not shown), a stack of Co/Pd layers (repeated (e.g. 5) several times) may be added between bottom electrode 48 and capping (Ta) 38 layers.

FIG. 3B shows s schematic cross section view of an exemplary device configuration 50 having a perpendicular fixed layer in accordance with the present invention. A dielectric tunnel barrier 34 (e.g. metal oxide such as MgO) is disposed between canted ferromagnetic (FM) free layer 36b (shown as $Co_{20}Fe_{60}B_{20}$, but may comprise variants of Fe, CoFe, CoFeB, TbFeCo, GdFeCo) and a ferromagnetic (in-plane) fixed layer 32b (shown as $Co_{20}Fe_{60}B_{20}$, but may comprise variants of Fe, CoFe, CoFeB, TbFeCo, GdFeCo, or multilayers containing two or more of the elements Pd, Pt, Co, Fe, CoFe, Ru and/or CoFeB). In this alternative configuration, metal spacer (Ru) 54 is disposed between a stack 52 of alternating Pd/Co layers (repeated several times, e.g. 10 times as shown in FIG. 3B) and a stack 56 of alternating Co/Pd layers (repeated several times, e.g. 5 times as shown in FIG. 3B) along with Co layer 57 may be added between top electrode 40 and fixed layer 32b. As in the configuration of FIG. 3A, top electrode 40 and bottom electrode 48 may be included, along with capping (Ta) layers 38 and 58 disposed on opposite sides of free layer 36b and fixed layer 32b respectively.

In one alternative embodiment (not shown), CoFe/PtMn layers may be disposed between the bottom electrode 48 and Ta 38 layers.

The stack configuration may be circular (e.g. 40 nm×40 nm), elliptical (e.g. 60 nm in y by 170 nm in x), or in other shapes such as a rectangle, with typical dimensions less than 200 nm on each side.

The magnetic bits shown in FIG. 1A through FIG. 4 may comprise any of the materials listed above, in addition to metal contacts. However, these materials are provided for exemplary purposes only, and many other materials or material combinations may be used to implement the devices of the present invention.

The overall structures 30/50 resemble a magnetic tunnel junction (MTJ), and exhibits tunneling magnetoresistance (TMR) that allows for reading of the magnetic state of the free layer by measuring the resistance across the stack. The dielectric layer 34 may be chosen to be thick enough to allow only for a small leakage current when voltages lower than the breakdown voltage are applied, making the device 30/50 behavior dominated by voltage (rather than current-induced) effects. Since the overall device 30 is a capacitive voltage-controlled device, it may be referred to as a magnetoelectric junction (MEJ).

The configurations of devices shown in FIG. 1A through FIG. 4 show the fixed layer on top and the free layer at the bottom of the stack. However, it is appreciated that the reverse configuration (free layer on top and the fixed layer at the bottom of the stack) is also contemplated.

Figure 4:
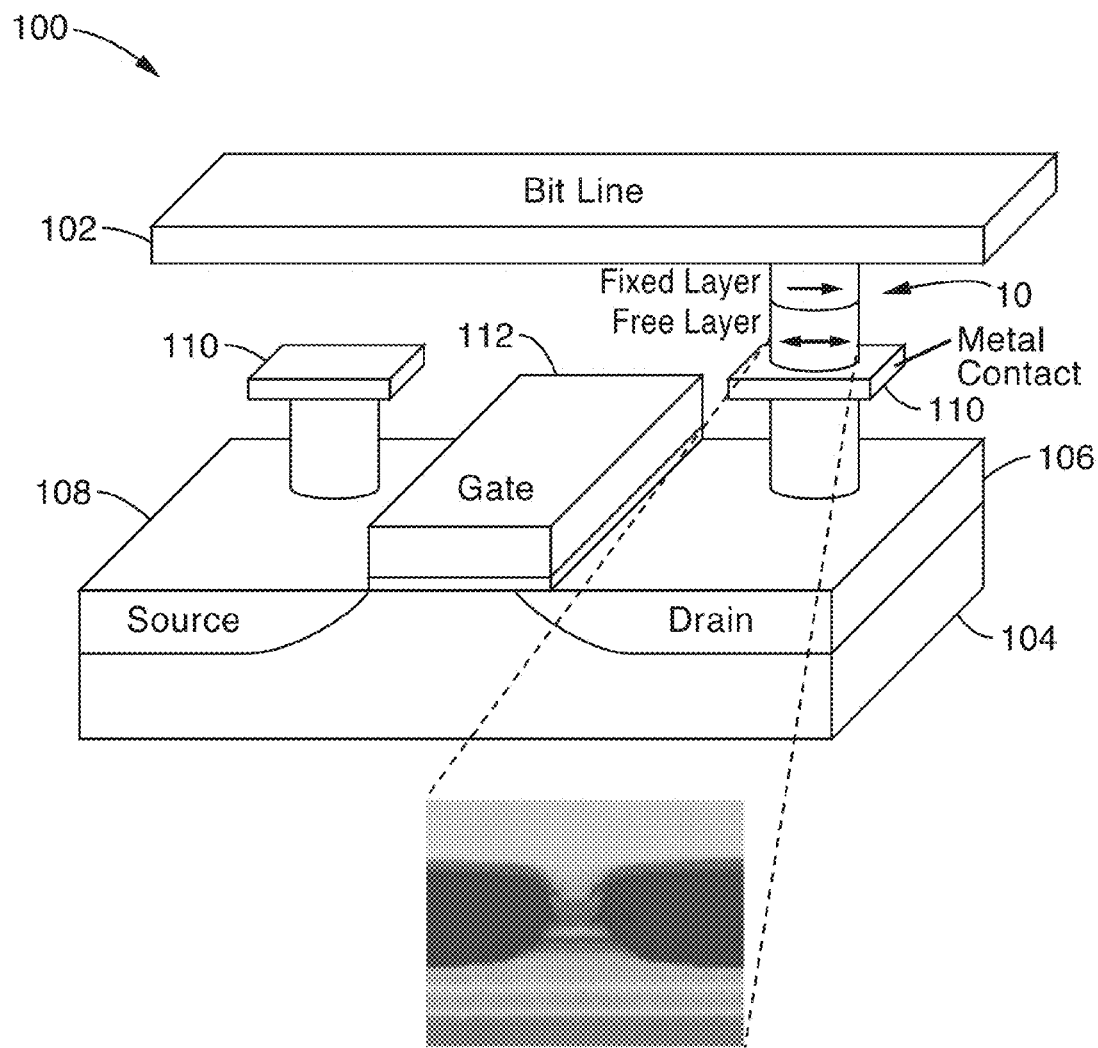
FIG. 4 shows a schematic diagram of an exemplary voltage tunable MERAM device in accordance with the present invention.

FIG. 4 shows a schematic diagram of an exemplary voltage tunable MERAM device 100 in accordance with the present invention. An array of memory bits 10 having a tilted magnetization free layer are disposed between bit line 102 and metal contacts 110 (note, the simplified structure 10 is shown for clarity, but will likely comprise a stack structure similar to that shown in devices 30/50 of FIG. 3A or FIG. 3B). The device may comprise a substrate 104 having a source 108, drain 106 and gate 112 as configured in FIG. 4. The inset of FIG. 4 illustrates an exemplary SEM image of a stacked memory bit structure.

The ferromagnetic free layer 36a/36b has an in-plane (IP) and an out-of-plane (OOP) perpendicular anisotropy. The OOP anisotropy is affected by the FM/DE interface, and can be controlled by the electric field (i.e. voltage) applied across the dielectric layer DE 46. The OOP anisotropy is increased/reduced depending on the polarity of the applied voltage (i.e. direction of the electric field). The OOP anisotropy can additionally be tuned by controlling the FM composition (e.g. higher OOP anisotropy for higher Fe content in CoFeB), and the FM thickness (OOP anisotropy is larger for thinner films). In addition, the free layer anisotropy is designed such that IP and OOP anisotropies nearly cancel out, resulting in a free layer magnetization that is neither completely in-plane nor out-of-plane. As a result, the sensitivity of the free layer magnetization to applied voltages (the voltage-induced torque) will be a function of the canting angle, and can be different for the HR and LR states. Thus, LR and HR canted states are designed such that they are differently manipulated by voltage pulses of different length and/or amplitude, allowing for selectivity in switching (i.e. control over the switching direction).

The torque applied on the free layer 36a/36b magnetization due to the application of a voltage to the device is a function of its canted free layer state (i.e. angle $\Theta_{LR}$ and $\Theta_{HR}$ with respect to the normal to the surface). Hence, HR and LR states in this invention may experience different torques depending on their relative orientations in space. Furthermore, the energy wells in the free layer 36a/36b corresponding to each of the LR and HR states can be designed to correspond to different resonance frequencies (i.e., depending on the canting angle, the overall effective magnetic field acting on the LR or HR states may be different). This means that by timing the voltage pulse applied to the device, one can bring about selective resonant switching of only the HR or the LR state, depending on the pulse width. Thereby, one can use the pulse width (for a fixed voltage polarity and fixed or varying pulse magnitude) to control the switching direction (LR to HR). Pulses timed correctly to correspond to the LR resonance will thus switch the free layer 36a/36b from LR to HR, and pulses timed to correspond to the HR resonance will switch it from HR to LR. In each case, the voltage polarity (positive or negative) is preferably to be selected such as to destabilize the free layer 36a/36b magnetization.

For a substantially in-plane free layer 36a, i.e. a device 30 with canted free layer where the canting angle is still close to the in-plane direction, this will in most cases be a voltage that increases the perpendicular anisotropy in the free layer. In this case, also it would be desirable to have a pinned layer 44 that is in-plane in order to achieve maximum TMR for readout.

For a substantially out-of-plane (e.g. perpendicular) free layer 36b, i.e. a device 50 with canted FL where the canting angle is close to the out-of-plane direction, this will in most cases be a voltage that reduces the perpendicular anisotropy. For a CoFeB free layer 36b and an MgO dielectric barrier 34, decrease of perpendicular anisotropy in many cases corresponds to voltages that lead to an accumulation of negative charges (electrons) at the CoFeB—MgO interface. However the selection of the proper voltage in each case depends on the voltage-dependence of anisotropy in the specific material system used, on the interface properties and atomistic structure, as well as the canting angles of the free layer magnetization. The main criterion is that the one voltage polarity be chosen which allows for switching, whereas the opposite polarity normally only stabilizes the free layer (and hence may be used for reading the state of information without disturbing the bit).

In addition to performing resonant (precessional) magnetization switching in both directions, an alternative possibility is to perform resonant switching for one direction and thermally-activated switching in the opposite direction. In this implementation, the overall magnetic stray field acting on the free layer is designed such as to favor switching in one direction (e.g. LR to HR) in the thermally activated regime (i.e. for long pulses typically >5 ns), while the canting angles are designed such as to favor precessional switching in the opposite (HR to LR) direction for shorter pulses (e.g. typically <2 ns). In one particular implementation (see Experiment #1 measurement data below), these pulses may correspond to ~10 ns and ~0.6 ns to achieve switching in opposite directions.

Experiment #1

To test the devices of the present invention detailed above, continuous multilayer films with a composition similar to that shown in FIG. 3A (e.g. substrate 49/bottom electrode 48/Ta (5 nm thickness)/$Co_{20}Fe_{60}B_{20}$ free layer 36a with thickness range($t_{CoFeB}$=1.0 nm-1.4 nm wedge)/MgO dielectric layer 34 with thickness range ($t_{MgO}$=1.2 nm-1.4 nm wedge)/$Co_{60}Fe_{20}B_{20}$ in-plane fixed layer 32a (2.7 nm thickness)/Ru layer 46 (0.85 nm thickness)/$Co_{70}Fe_{30}$ layer 44 (2.3 thickness)/PtMn layer 42 (20 nm thickness)/top electrode 40 were deposited in a Singulus TIMARIS physical vapor deposition (PVD) system, and subsequently annealed at 300° C. for 2.0 hours in an in-plane magnetic field of 1 T. The films were then patterned into 170 nm×60 nm elliptical nanopillars for electrical measurements using electron-beam lithography and ion milling techniques. The readout of the state of the free layer is performed via the TMR effect and all the measurements were performed at room temperature.

The device structure 30 of the present invention is different from those of STT devices which use free layers with interfacial perpendicular anisotropy in at least two ways: Firstly, the MgO tunneling barrier 34 thickness is configured to be thick enough to make current-induced STT negligible (maximum currents were <0.2 MA/cm² in our experiments). Secondly, the free layer 36a thickness in structure 30 is configured to be much closer to the compensation point between in-plane shape anisotropy and interfacial perpendicular anisotropy in order to increase the tunability of the free layer magnetization by voltage.

The overall first-order perpendicular anisotropy in the free layer 36a, given by $K_{1,eff}=K_s(V)/t_{CoFeB}-2\pi M_s^2$, where $K_s(V)$ is the (voltage-dependent) surface perpendicular anisotropy at the CoFeB—MgO interface, $t_{CoFeB}$ is the thickness of the free layer, and $M_s$ is the free layer saturation magnetization, nearly cancels in device 30. Under such conditions, it was previously shown that the contribution of the second order anisotropy $K_2$ becomes more important in describing the free layer dynamics. Taking into account that the energy associated with the perpendicular anisotropy is given by $E_\perp=K_{1,eff}\sin^2(\theta)+K_2\sin^4(\theta)$, where $\theta$ is the angle of the magnetization with respect to the normal of the film, the free layer 36a can have equilibrium states as dictated in Eq. 1:

$$\theta_c = \pm\sin^{-1}\left(\sqrt{\frac{|K_{1,eff}|}{2K_2}}\right) \quad \text{Eq. 1}$$

under the condition $0>K_{1,eff}>-2K_2$. Therefore, by fine-tuning $K_{1,eff}$, i.e., tuning the thickness $t_{CoFeB}$ close to the transition thickness for cancellation of perpendicular (interfacial) and shape-induced (in-plane) anisotropies in the free layer 36a, canting of the equilibrium states in the free layer 36a can be obtained. Note that Eq. 1 allows for four different equilibrium states, but that for a device with an in-plane fixed layer only two different associated resistance values would be measured.

Figure 5A:
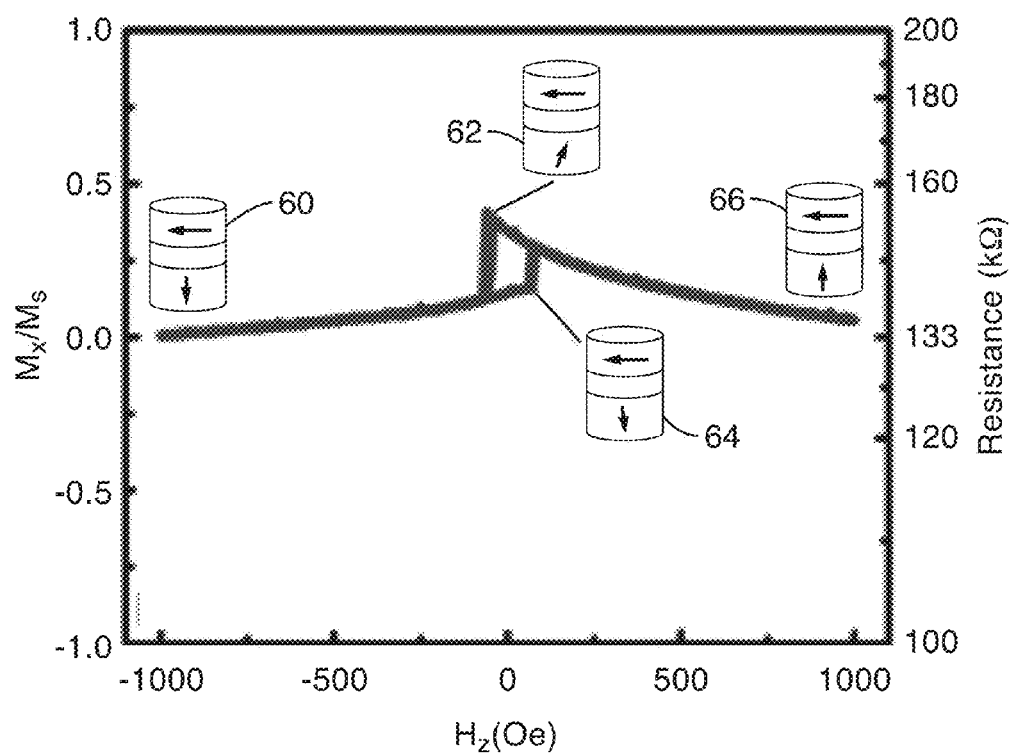
FIG. 5A and FIG. 5B show plots of the out-of-plane (FIG. 5A) and in-plane (FIG. 5B) hysteresis loops for an exemplary memory device in accordance with the present invention.
Figure 5B:
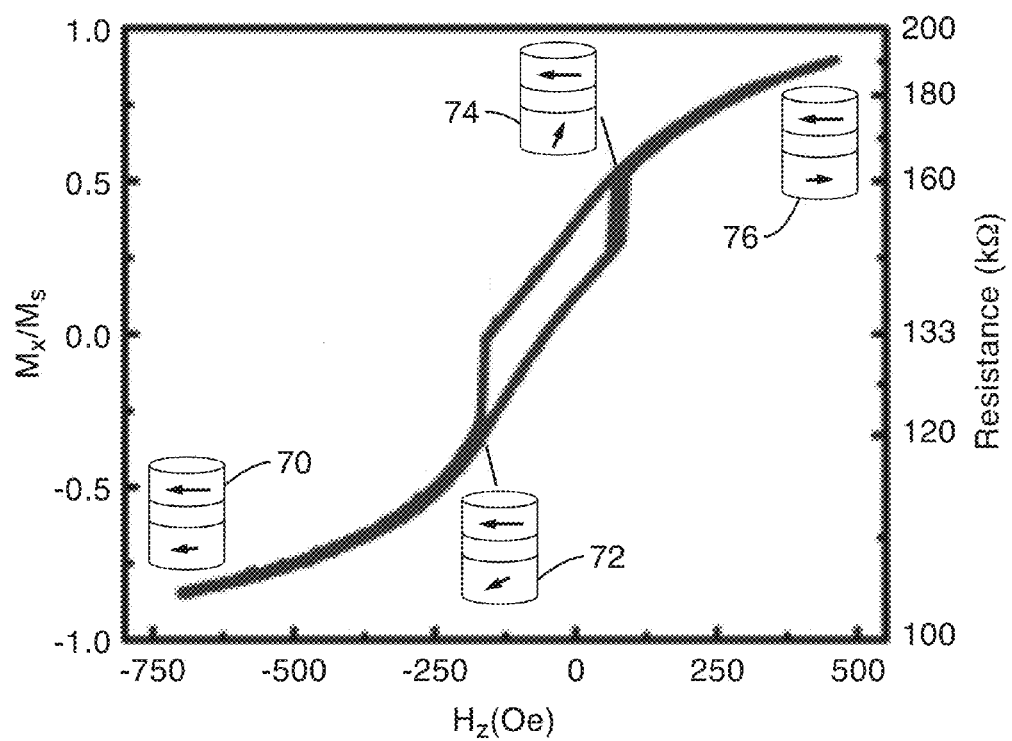

FIG. 5A and FIG. 5B show plots of the out-of-plane (FIG. 5A) and in-plane (FIG. 5B) hysteresis loops for a device 30 with $t_{CoFeB}$=1.13 nm and RA product ~800 Ω-μm² in the parallel state ($R_P\approx$100 kΩ). The magnetoresistance versus (FIG. 5A) out-of-plane $H_z$ and, (FIG. 5B) in-plane $H_x$ field curves demonstrate hysteresis loops (~120 Oe and ~70 Oe respectively) in both directions for a device where the free layer shows canted equilibrium states, as schematically shown by the arrows 60, 62, 64, and 66 indicating the magnetization configuration along the $H_z$ curve and arrows 70, 72, 74, and 76 indicating the magnetization configuration along the $H_X$ curve.

We estimate the magnetization component along the x-direction $M_x/M_s=m_x=\sin(\theta)$ from the measured resistance values as:

$$\frac{M_x}{M_s} = \frac{(R(H)-R_\perp)(R_{AP}+R_P)}{R(H)(R_{AP}-R_P)} \quad \text{Eq. 2}$$

where $R_{AP}$ is the resistance of the anti-parallel state ($R_{AP}\approx$200 kΩ in this device), R(H) is the measured resistance for a given value of the applied magnetic field, $R_\perp=2R_{AP}R_P/(R_{AP}+R_P)\approx$133 kΩ is the resistance when the free layer is completely perpendicular ($m_x$=0) and the fixed layer is assumed to have $m_x$=−1. It was noticed that the magnetization in the free layer has a tendency to favor $m_x$>0 in the perpendicular R-H loop (FIG. 5A), a consequence of the offset field $H_{x,off}\approx$−45 Oe due to the non-zero dipole coupling to the fixed layer. This offset field also translates into a shift in the in-plane R-H loop with respect to $H_x$=0 (FIG. 5B). Finally, it was noted that, although the tested devices have TMR=$(R_{AP}-R_P)/R_P\approx$100%, the effective MR ratio between the high- and low-resistance canted states (HR and LR respectively) is relatively small (($\Delta R/R)_{eff}$~9%), which we estimate corresponds to a separation in between the equilibrium angles $\Delta\theta\approx$14°.

Figure 6:
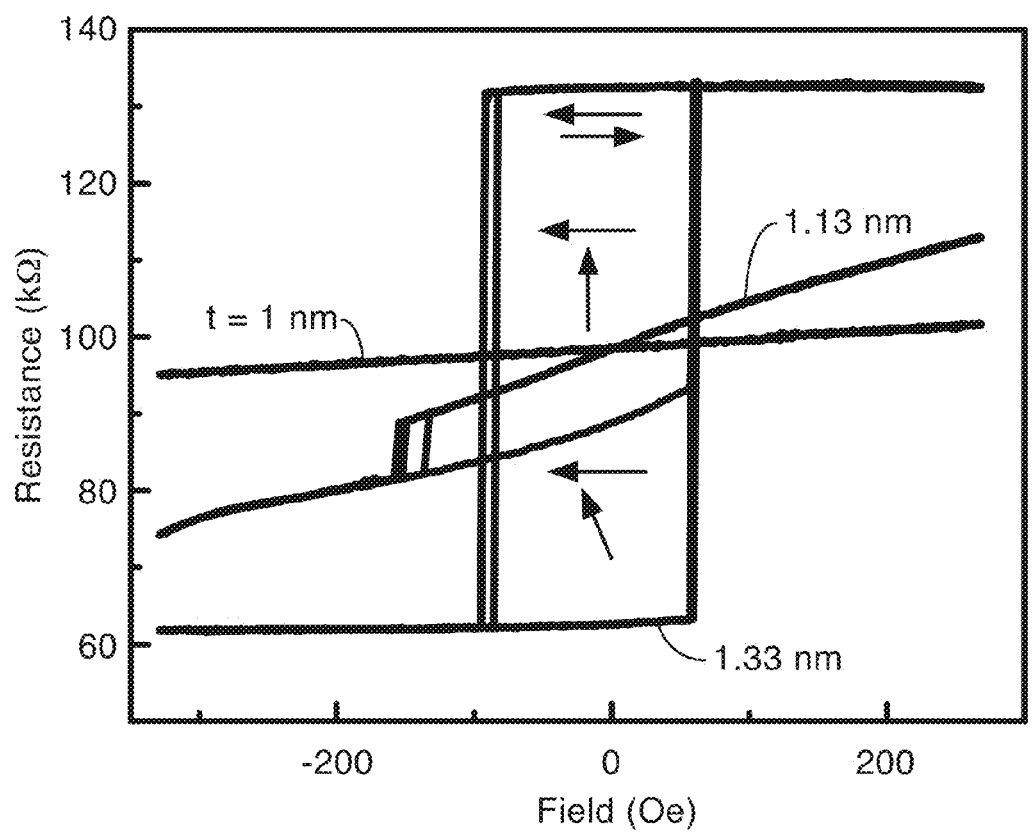
FIG. 6 shows a plot of measurements of the electric resistance versus in-plane magnetic field (R-H) loops for various free layer thicknesses, where the field $H_x$ is applied along the major axis of the elliptical nanomagnets.

The dependence of the overall free layer 36a anisotropy on thickness ($t_{CoFeB}$) is evident form electrical measurements on patterned MTJ nanopillars with different $Co_{20}Fe_{60}B_{20}$ thickness values, while keeping the resistance-area (RA) product constant. FIG. 6 shows a plot of measurements of the electric resistance versus in-plane magnetic field (R-H) loops for various free layer thicknesses, where the field $H_x$ is applied along the major axis of the elliptical nanomagnets. The device with $t_{CoFeB}$=1.33 nm shows a square-shaped hysteresis behavior, corresponding to an in-plane easy-axis defined by the ellipse's shape anisotropy, whereas the $t_{CoFeB}$=1 nm device shows a hard-axis behavior with no hysteresis, indicating that the free layer easy axis is perpendicular to the sample plane. For the device with $t_{CoFeB}$=1.13 nm, the shape of the R-H loop shows a similar hard-axis behavior, but hysteresis is observed, which can be attributed to canting of the equilibrium states for magnetization in the free layer. The latter thickness value for the free layer is actually close to the transition thickness for the tested samples, which was found to be ~1.1 nm in film level measurements, allowing for the presence of canted states as previously discussed.

In sum, FIG. 6 demonstrates that the state of the free layer in the tested devices is sensitive to the interfacial perpendicular anisotropy, going from an in-plane to an out-of-plane easy axis when the thickness of the free layer is tuned from 1.33 nm to 1 nm. For an intermediate thickness (1.13 nm), we observe the formation of canted equilibrium states in the free layer.

The perpendicular interfacial anisotropy can be modulated by the electric field applied across the MgO layer, making the coercivity and the state of the free layer voltage-dependent in our samples. In our experiment, positive voltages, i.e., the accumulation of electrons near the $Co_{20}Fe_{60}B_{20}$—MgO interface, reduce the interfacial anisotropy $K_s(V)$.

Figure 7:
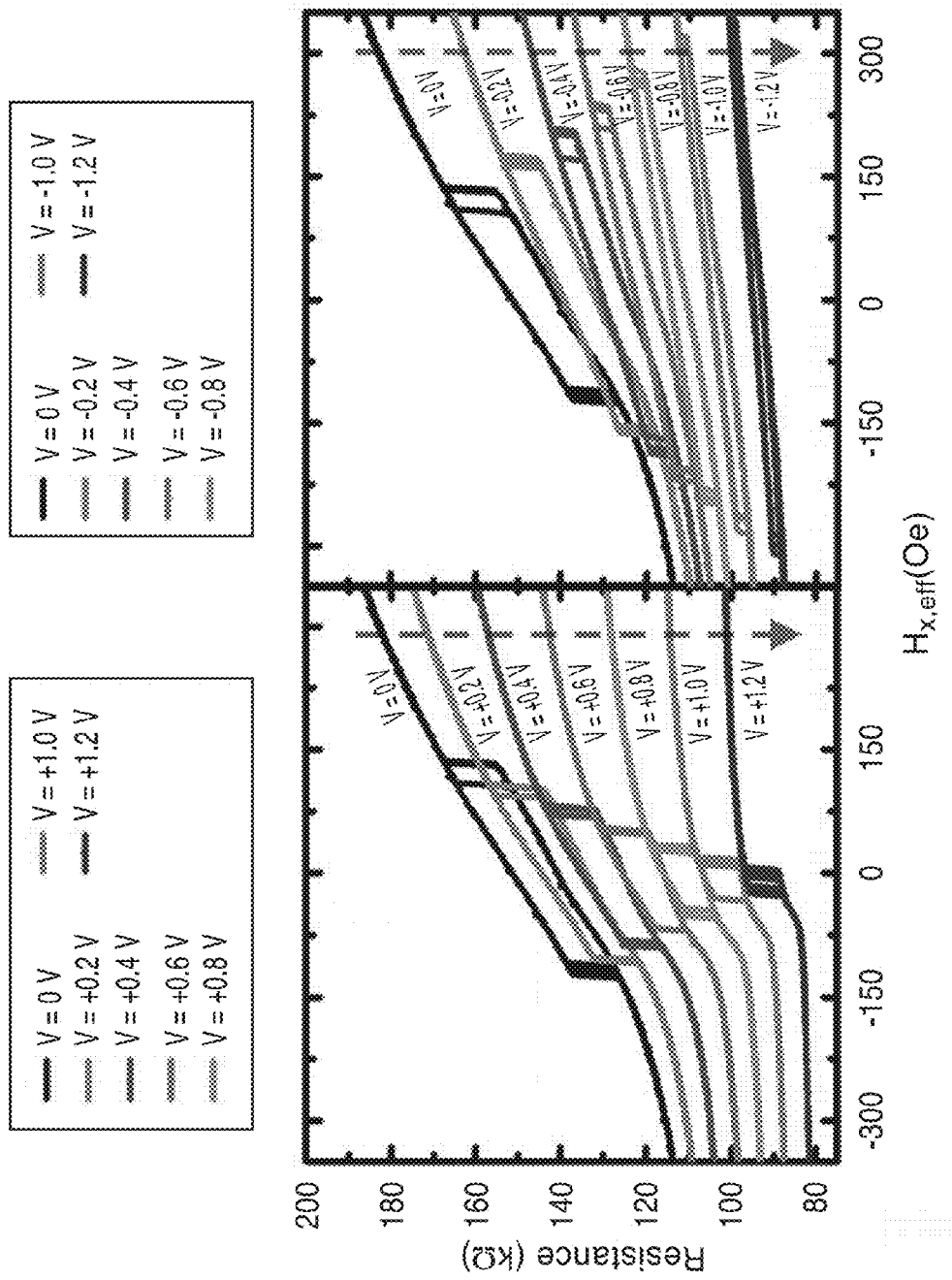
FIG. 7 shows magnetoresistance versus effective in-plane magnetic field curves for different bias voltage levels.

FIG. 7 shows magnetoresistance versus effective in-plane magnetic field ($H_{x,eff}=H_x-H_{x,off}$) curves for different bias voltage levels. As the positive voltage is increased, the hysteresis loops tend to become more square-shaped, indicating a tendency for the free layer easy-axis to become in-plane due to the reduction of the perpendicular anisotropy. At the same time, we observe a reduction in the coercivity from ~120 Oe at equilibrium to ~10-20 Oe for voltages around +1 V, whereas the reduction of the MTJ resistance can be accounted for by the bias dependence of TMR. When the voltage polarity is reversed, increasing the negative voltage further enhances the perpendicular anisotropy, translating into an increase of the coercivity with respect to the equilibrium state, which confirms the VCMA-controlled nature of the state of the free layer. Note also that, the changes in coercivity with anisotropy are consistent with a free layer that is nearly perpendicular to the sample plane, consistent with the small values for the canting angle obtained from magnetoresistance measurements. Also, as the perpendicular anisotropy is increased by negative voltages, the overall first-order anisotropy $K_{1,eff}$ approaches the compensation point, thus reducing the separation between the equilibrium angles (see Eq. (1), which corresponds well with the observed reduction in the MR ratio in between the LR and HR canted states, as measured at the loop center. Eventually, a large enough negative voltage will force the free layer magnetization entirely out of plane ($K_{1,eff} \geq 0$), although we were not able to reach this fully perpendicular state in our samples due to approaching their breakdown voltage.

In the present experiment, the reduction of coercivity with positive voltages was exploited in order to electrically switch between two thermally stable canted states (we estimate an energy barrier for thermally induced switching of $E_b \approx 42$ kT at $H_{x,eff}=0$ from magnetic-field-dependent switching measurements) without the influence of spin polarized currents.

Figure 8:
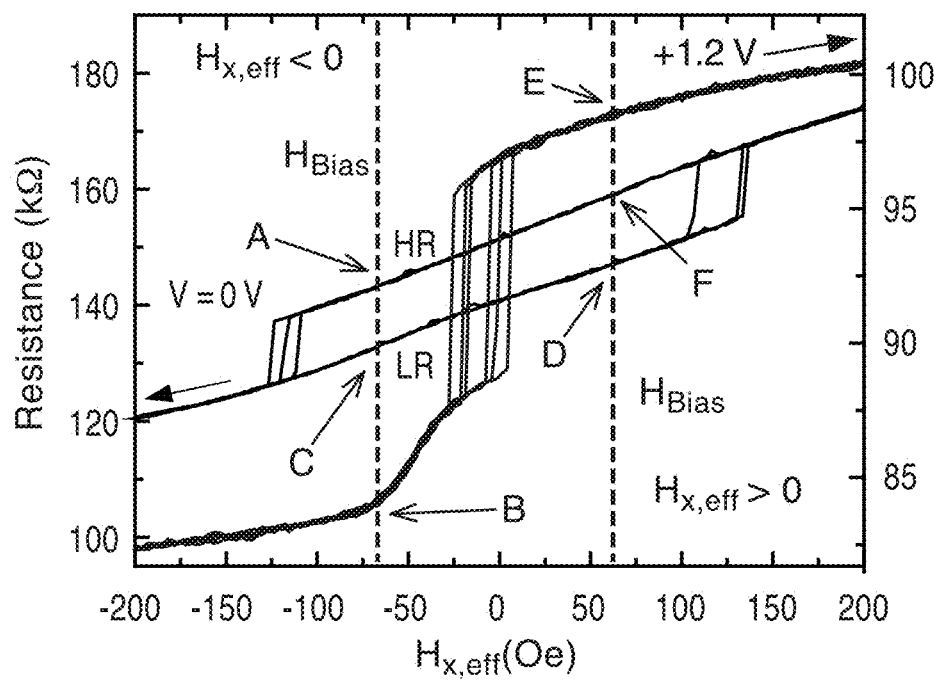
FIG. 8 is a plot of the magnetic hysteresis curves at equilibrium (0 V) and at a positive voltage to illustrate the switching process in accordance with the present invention.
Figure 9A:
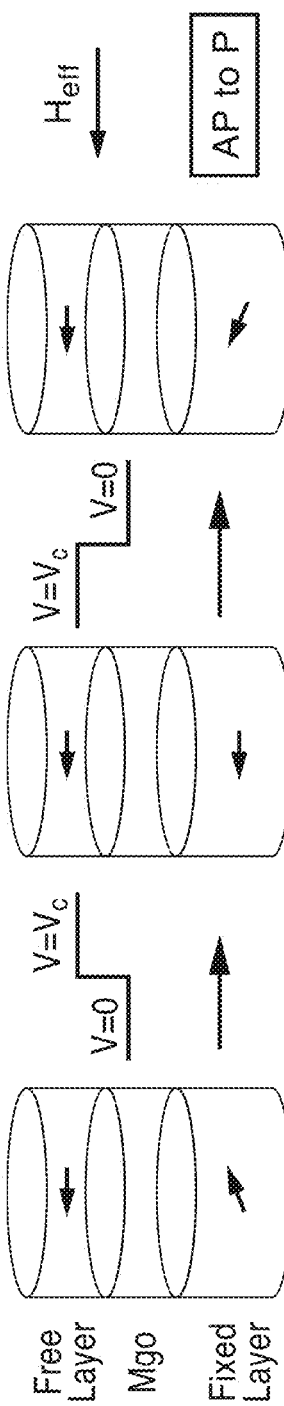
FIG. 9A and FIG. 9B illustrate schematic diagrams of the magnetization of the tested structure along various points on the curve of FIG. 8.
Figure 9B:
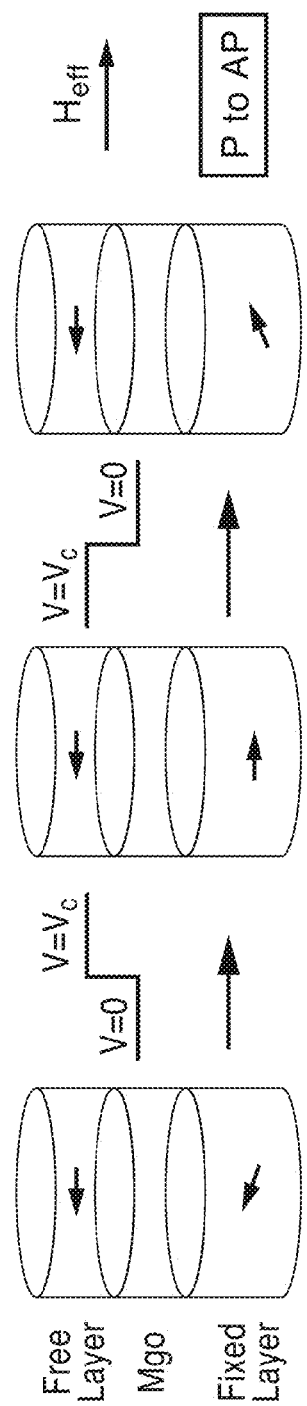

FIG. 8 is a plot of the magnetic hysteresis curves at equilibrium (0 V) and at a positive voltage to illustrate the switching process. FIG. 9A and FIG. 9B illustrate schematic diagrams of the magnetization of the tested structure along various points in the curve of FIG. 8. It is assumed that the device is biased by an in-plane field $H_{bias}$ in the range where $H_{x,eff}<0$, resting in the high-resistance (HR) canted state (point A in FIG. 8 and schematically illustrated in FIG. 9A). When a positive voltage pulse is applied, the perpendicular anisotropy of the free layer decreases, reducing its coercivity. As a result, under the new energy landscape the magnetization thermally switches to a low-resistance intermediate state (point B FIG. 8 and schematically illustrated in FIG. 9A). After the voltage is removed, the magnetization reconfigures into the low-resistance (LR) canted state (point C FIG. 8 and schematically illustrated in FIG. 9A), completing the reversal process and relaxing to the opposite state (points D, E, and F in FIG. 8 and schematically illustrated in FIG. 9B). FIG. 8 shows that the sign of the effective field acting on the free layer will determine the direction of switching, and hence the voltage-induced switching is unidirectional for a given bias magnetic field.

Under this scheme, we have demonstrated voltage-induced switching between canted states with voltage pulses down to 10 ns and amplitudes of ~1 V for both low- to high-resistance (LR to HR), and HR to LR switching directions. Switching in both directions was performed using voltages of the same polarity, with a small bias magnetic field to determine the switching direction, as discussed above.

Figure 10A:
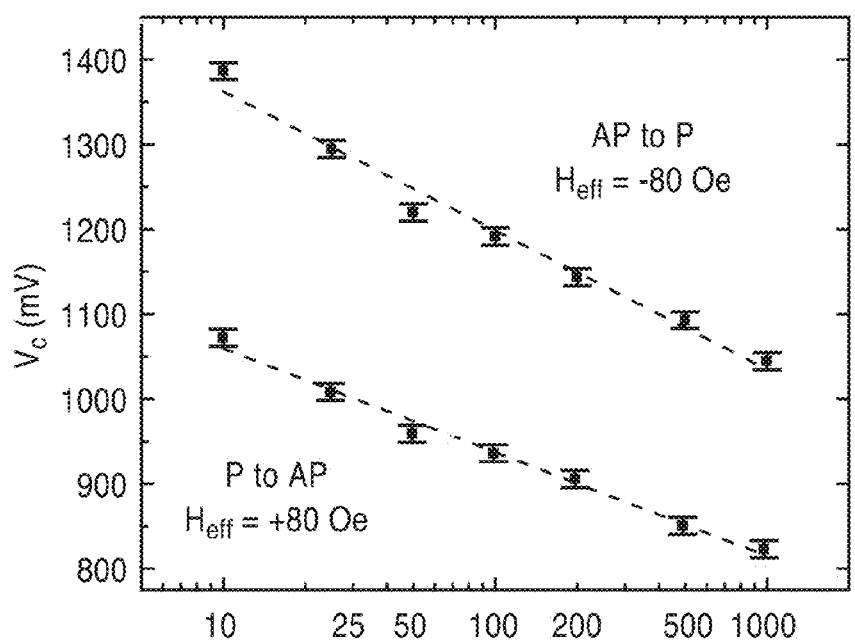
FIG. 10A and FIG. 10B are plots illustrating dependence of pulse width and magnetic field dependence.
Figure 10B:
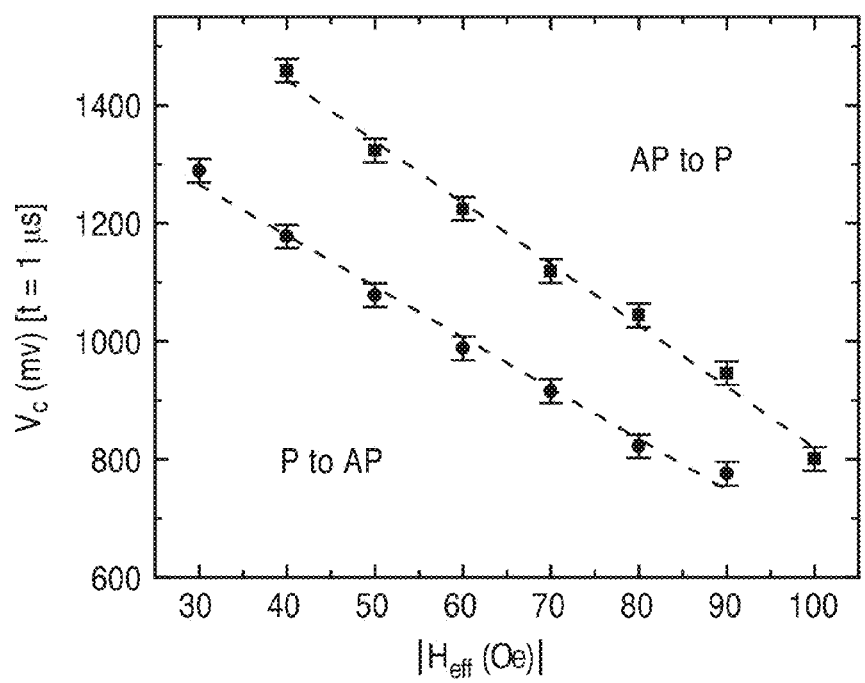

FIG. 10A and FIG. 10B are plots illustrating dependence of pulse width and magnetic field dependence. FIG. 10A shows the dependence of the mean switching voltage $V_c$ on the applied voltage pulse width t, measured down to 10 ns, obtained from >100 switching events for each data point. The dependence of switching voltage on pulse width follows a thermal activation model, which can be well fitted to a function of the form $V_c=V_{c0}(1-\Delta^{-1} \ln(t/\tau_0))$, where $\tau_0$ is the so-called attempt time corresponding to the inverse of the precession frequency of the magnetization, $V_{c0}$ is the extrapolated critical voltage for switching at $t=\tau_0$ and $\Delta$ is proportional to the energy barrier that the magnetization transverses during the reversal process. We also measured the dependence of the switching voltage on the applied magnetic field. FIG. 10B shows a linear decrease of the switching voltage with increasing $H_{x,eff}$, indicating a trade-off between the switching voltage amplitude and the in-plane magnetic field which assists the switching process.

To eliminate the need for two different bias magnetic fields for switching in opposite directions in our devices, one possible approach is to utilize precessional switching for the direction which is disfavored for thermally-activated switching at a given fixed bias $H_{bias}$. By applying an external field $H_{bias}=+40$ Oe at a 39° angle, we find that our system has equilibrium canted states at angles $\theta_{LR} \approx 13°$ and $\theta_{HR} \approx 27°$, calculated based on the measured resistance values ($R_{LR} \approx 144$ kΩ and $R_{HR} \approx 157$ kΩ respectively) similar to the above discussion. Under the presence of a voltage pulse, these two states will experience different VCMA-induced torques, where the HR state will have a higher torque due to its larger separation from the out-of-plane condition, therefore favoring HR to LR over LR to HR precessional switching.

Figure 11:
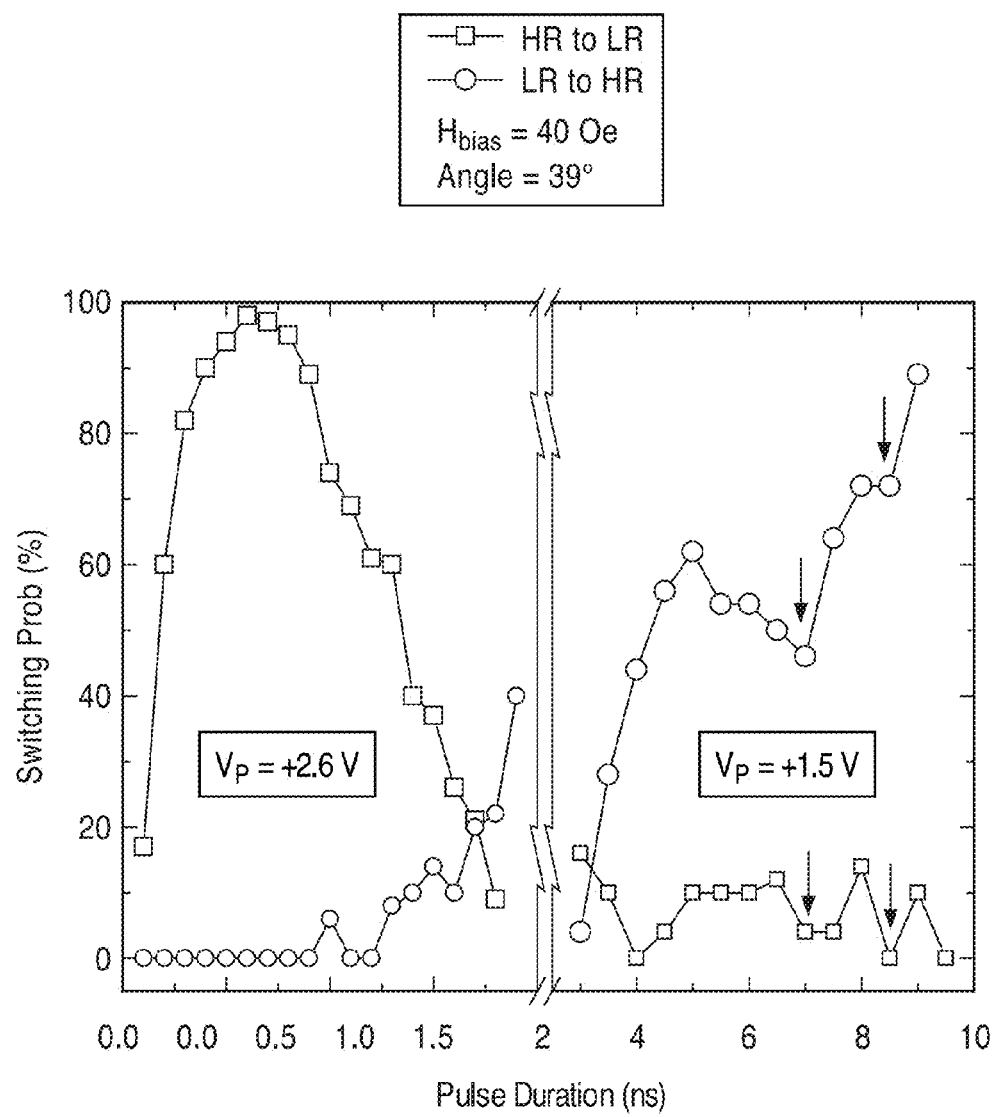
FIG. 11 shows a plot of switching probability measurement results for the tested device as a function of the applied voltage pulse width.

FIG. 11 shows switching probability measurement results for the tested device as a function of the applied voltage pulse width, demonstrating that HR to LR switching can be obtained for ~600 ps voltage pulses, while we do not observe switching in the reverse (LR to HR) direction under those conditions. The selective precessional switching, unlike previous reports on symmetric (toggle) VCMA-induced precessional switching, is a consequence of the configuration of the canted equilibrium states in the free layer. In order to switch in the opposite direction, the bias field favors LR to HR thermally-activated switching, as shown in FIG. 11. We note, however, that the increase of the switching probability due to thermally-activated switching is super-imposed onto features corresponding to a low-probability precessional switching in both directions, which can be observed both in LR to HR and HR to LR curves (black arrows in FIG. 11).

In conclusion, it was demonstrated electric-field-based manipulation and switching of MTJ devices can be achieved with canted free layers using the voltage-controlled magnetic anisotropy (VCMA) at the interface of MgO and CoFeB films. Thermally-activated switching down to 10 ns, assisted by a small (fewer than 10 Oe) bias field, without the influence of spin-polarized currents was shown. To avoid the need for different bias magnetic fields, it was also demonstrated that the canting of the free layer allows for combining thermally-activated and precessional switching regimes for bidirectional switching under a fixed magnetic field. Although the energy required for switching in our devices (~30 fJ and ~70 fJ for HR to LR and LR to HR respectively) is still dominated by undesired leakage currents, our results show a significant improvement in switching energy compared to STT-based devices. These results represent a step towards the realization of fully voltage-controlled magnetoelectric memory and logic devices, which can be significantly more energy-efficient and scalable than existing magnetic devices which utilize current-induced torques.

Embodiments of the present invention may be described with reference to flowchart illustrations of methods and systems according to embodiments of the invention, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula (e), or computational depiction(s).

From the discussion above it will be appreciated that the invention can be embodied in various ways, including the following:

1. A memory element, comprising: a ferromagnetic free layer; and a ferromagnetic fixed layer separated from the free layer; wherein information is stored in a magnetization state of the free layer; wherein said magnetization state comprises two stable states that are canted to form an angle with respect to horizontal and vertical directions of the free layer; and wherein the free layer magnetization is switchable between the two canted states by the application of a voltage to modify the perpendicular magnetic anisotropy of the free layer.

2. The memory element of any preceding embodiment, wherein the free layer and fixed layer are separated by a dielectric layer. 3. The memory element of any preceding embodiment, wherein the dielectric layer comprises a metal oxide.

4. The memory element of any preceding embodiment, wherein the fixed layer has a magnetization orientation that is in-plane with respect to the fixed layer and free layer.

5. The memory element of any preceding embodiment, wherein the fixed layer has a magnetization orientation that is out-of-plane with respect to the fixed layer and free layer.

6. The memory element of any preceding embodiment, wherein the free layer, fixed layer, and dielectric layer are configured such that the direction of switching between the two canted states is affected by a magnitude of a voltage applied across the fixed layer and free layer.

7. The memory element of any preceding embodiment, wherein the free layer, fixed layer, and dielectric layer are configured such that the direction of switching between the two canted states is affected by a width of a voltage pulse applied across the fixed layer and free layer.

8. The memory element of any preceding embodiment, wherein the free layer, fixed layer, and dielectric layer are configured such that the direction of switching between the two canted states is affected by setting the magnetization into a precessional motion upon application of a voltage pulse having a pulse width timed to affect switching to an opposite stable canted state 9. The memory element of any preceding embodiment, wherein the free layer comprises an energy barrier configured such that the direction of switching between the two canted states is affected by setting the magnetization into a semi-stable state upon application of a voltage and then achieving switching through thermal activation.

10. The memory element of any preceding embodiment, wherein the canted free layer magnetization states comprise a stable high resistance state HR and low resistance state LR.

11. The memory element of any preceding embodiment, wherein the dielectric barrier comprises a tunneling barrier having a thickness large enough to substantially negate current-induced spin-transfer-torque (STT).

12. The memory element of any preceding embodiment, wherein the free layer has a thickness configured to correspond to a compensation point between in-plane shape anisotropy and interfacial perpendicular anisotropy to allow for maximized tunability of the free layer magnetization by application of voltage.

13. The memory element of any preceding embodiment, wherein free layer, fixed layer, and dielectric layer are disposed within a cell forming magneto-electric random access memory (MERAM).

14. The memory element of any preceding embodiment, further comprising a second fixed layer separated from the free layer by a metal spacer.

15. The memory element of any preceding embodiment: wherein the fixed layer has a magnetization orientation that is in-plane with respect to the fixed layer and free layer; and wherein the second fixed layer has a magnetization orientation that is out-of-plane with respect to the fixed layer and free layer.

16. The memory element of any preceding embodiment: wherein the fixed layer has a magnetization orientation that is out-of-plane with respect to the fixed layer and free layer; and wherein the second fixed layer has a magnetization orientation that is in-plane with respect to the fixed layer and free layer.

17. A magnetic tunnel junction, comprising: a ferromagnetic free layer having a magnetization state; and a ferromagnetic fixed layer separated from the free layer by a dielectric layer; wherein said magnetization state comprises two stable states that are canted to form an angle with respect to horizontal and vertical directions of the free layer; and wherein the free layer magnetization is switchable between the two canted states by the application of a voltage that modifies the perpendicular magnetic anisotropy of the free layer.

18. The magnetic tunnel junction of any preceding embodiment, wherein information is stored in a magnetization state of the free layer to form a memory cell.

19. The magnetic tunnel junction of any preceding embodiment, wherein the fixed layer has a magnetization orientation that is in-plane with respect to the fixed layer and free layer.

20. The magnetic tunnel junction of any preceding embodiment, wherein the fixed layer has a magnetization orientation that is out-of-plane with respect to the fixed layer and free layer.

21. The magnetic tunnel junction of any preceding embodiment, wherein the free layer, fixed layer, and dielectric layer are configured such that the direction of switching between the two canted states is affected by a magnitude of a voltage applied across the fixed layer and free layer.

22. The magnetic tunnel junction of any preceding embodiment, wherein the free layer, fixed layer, and dielectric layer are configured such that the direction of switching between the two canted states is affected by a width of a voltage pulse applied across the fixed layer and free layer.

23. The magnetic tunnel junction of any preceding embodiment, wherein the free layer, fixed layer, and dielectric layer are configured such that the direction of switching between the two canted states is affected by setting the magnetization into a precessional motion upon application of a voltage pulse having a pulse width timed to affect switching to an opposite stable canted state 24. The magnetic tunnel junction of any preceding embodiment, wherein the free layer comprises an energy barrier configured such that the direction of switching between the two canted states is affected by setting the magnetization into a semi-stable state upon application of a voltage and then achieving switching through thermal activation.

25. The magnetic tunnel junction of any preceding embodiment, wherein the canted free layer magnetization states comprise a stable high resistance state HR and low resistance state LR.

26. The magnetic tunnel junction of any preceding embodiment, wherein the dielectric barrier comprises a tunneling barrier having a thickness large enough to substantially negate current-induced spin-transfer-torque (STT).

27. The magnetic tunnel junction of any preceding embodiment, wherein the free layer has a thickness configured to correspond to a compensation point between in-plane shape anisotropy and interfacial perpendicular anisotropy to allow for maximized tunability of the free layer magnetization by application of voltage.

28. A method for storing memory within a memory cell, comprising: applying a voltage across a ferromagnetic free layer and a ferromagnetic fixed layer separated from the free layer by a dielectric layer; wherein the free layer comprises a magnetization state; and wherein said magnetization state comprises two stable states that are canted to form an angle with respect to horizontal and vertical directions of the free layer; and switching between the two canted states by the application of a voltage to modify the perpendicular magnetic anisotropy of the free layer.

29. The method of any preceding embodiment, wherein the direction of switching between the two canted states is affected by a magnitude of a voltage applied across the fixed layer and free layer.

30. The method of any preceding embodiment, wherein the direction of switching between the two canted states is affected by a width of a voltage pulse applied across the fixed layer and free layer.

31. The method of any preceding embodiment, wherein the direction of switching between the two canted states is affected by setting the magnetization into a precessional motion upon application of a voltage pulse having a pulse width timed to affect switching to an opposite stable canted state 32. The method of any preceding embodiment, wherein the free layer comprises an energy barrier configured such that the direction of switching between the two canted states is affected by setting the magnetization into a semi-stable state upon application of a voltage and then achieving switching through thermal activation.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A memory element, comprising:
   a ferromagnetic free layer; and
   a ferromagnetic fixed layer separated from the free layer;
   wherein information is stored in a magnetization state of the free layer;
   wherein said magnetization state comprises two stable states that are canted to form an angle with respect to horizontal and vertical directions of the free layer; and
   wherein the free layer magnetization is switchable between the two canted states by the application of a voltage to modify the perpendicular magnetic anisotropy of the free layer.

2. A memory element as recited in claim 1, wherein the free layer and fixed layer are separated by a dielectric layer.

3. A memory element as recited in claim 2, wherein the dielectric layer comprises a metal oxide.

4. A memory element as recited in claim 2, wherein the fixed layer has a magnetization orientation that is in-plane with respect to the fixed layer and free layer.

5. A memory element as recited in claim 2, wherein the fixed layer has a magnetization orientation that is out-of-plane with respect to the fixed layer and free layer.

6. A memory element as recited in claim 2, wherein the free layer, fixed layer, and dielectric layer are configured such that the direction of switching between the two canted states is affected by a magnitude of a voltage applied across the fixed layer and free layer.

7. A memory element as recited in claim 2, wherein the free layer, fixed layer, and dielectric layer are configured such that the direction of switching between the two canted states is affected by a width of a voltage pulse applied across the fixed layer and free layer.

8. A memory element as recited in claim 2, wherein the free layer, fixed layer, and dielectric layer are configured such that the direction of switching between the two canted states is affected by setting the magnetization into a precessional motion upon application of a voltage pulse having a pulse width timed to affect switching to an opposite stable canted state.

9. A memory element as recited in claim 2, wherein the free layer comprises an energy barrier configured such that the direction of switching between the two canted states is affected by setting the magnetization into a semi-stable state upon application of a voltage and then achieving switching through thermal activation.

10. A memory element as recited in claim 2, wherein the canted free layer magnetization states comprise a stable high resistance state HR and low resistance state LR.

11. A memory element as recited in claim 2, wherein the dielectric Layer comprises a tunneling barrier having a thickness large enough to substantially negate current-induced spin-transfer-torque (STT).

12. A memory element as recited in claim 2, wherein the free layer has a thickness configured to correspond to a compensation point between in-plane shape anisotropy and interfacial perpendicular anisotropy to allow for maximized tunability of the free layer magnetization by application of voltage.

13. A memory element as configured in claim 2, wherein free layer, fixed layer, and dielectric layer are disposed within a cell forming magneto-electric random access memory (MERAM).

14. A memory element as configured in claim 2, further comprising a second fixed layer separated from the free layer by a metal spacer.

15. A memory element as configured in claim 14:
wherein the fixed layer has a magnetization orientation that is in-plane with respect to the fixed layer and free layer; and
wherein the second fixed layer has a magnetization orientation that is out-of-plane with respect to the fixed layer and free layer.

16. A memory element as recited in claim 14:
wherein the fixed layer has a magnetization orientation that is out-of-plane with respect to the fixed layer and free layer; and
wherein the second fixed layer has a magnetization orientation that is in-plane with respect to the fixed layer and free layer.

17. A magnetic tunnel junction, comprising:
a ferromagnetic free layer having a magnetization state; and
a ferromagnetic fixed layer separated from the free layer by a dielectric layer;
wherein said magnetization state comprises two stable states that are canted to form an angle with respect to horizontal and vertical directions of the free layer; and
wherein the free layer magnetization is switchable between the two canted states by the application of a voltage that modifies the perpendicular magnetic anisotropy of the free layer.

18. A magnetic tunnel junction as recited in claim 17, wherein information is stored in a magnetization state of the free layer to form a memory cell.

19. A magnetic tunnel junction as recited in claim 17, wherein the fixed layer has a magnetization orientation that is in-plane with respect to the fixed layer and free layer.

20. A magnetic tunnel junction as recited in claim 17, wherein the fixed layer has a magnetization orientation that is out-of-plane with respect to the fixed layer and free layer.

21. A magnetic tunnel junction as recited in claim 17, wherein the free layer, fixed layer, and dielectric layer are configured such that the direction of switching between the two canted states is affected by a magnitude of a voltage applied across the fixed layer and free layer.

22. A magnetic tunnel junction as recited in claim 17, wherein the free layer, fixed layer, and dielectric layer are configured such that the direction of switching between the two canted states is affected by a width of a voltage pulse applied across the fixed layer and free layer.

23. A magnetic tunnel junction as recited in claim 17, wherein the free layer, fixed layer, and dielectric layer are configured such that the direction of switching between the two canted states is affected by setting the magnetization into a precessional motion upon application of a voltage pulse having a pulse width timed to affect switching to an opposite stable canted state.

24. A magnetic tunnel junction as recited in claim 17, wherein the free layer comprises an energy barrier configured such that the direction of switching between the two canted states is affected by setting the magnetization into a semi-stable state upon application of a voltage and then achieving switching through thermal activation.

25. A magnetic tunnel junction as recited in claim 17, wherein the canted free layer magnetization states comprise a stable high resistance state HR and low resistance state LR.

26. A magnetic tunnel junction as recited in claim 17, wherein the dielectric barrier comprises a tunneling barrier having a thickness large enough to substantially negate current-induced spin-transfer-torque (STT).

27. A magnetic tunnel junction as recited in claim 17, wherein the free layer has a thickness configured to correspond to a compensation point between in-plane shape anisotropy and interfacial perpendicular anisotropy to allow for maximized tunability of the free layer magnetization by application of voltage.

28. A method for storing memory within a memory cell, comprising:
applying a voltage across a ferromagnetic free layer and a ferromagnetic fixed layer separated from the free layer by a dielectric layer;
wherein the free layer comprises a magnetization state; and
wherein said magnetization state comprises two stable states that are canted to form an angle with respect to horizontal and vertical directions of the free layer; and
switching between the two canted states by the application of a voltage to modify the perpendicular magnetic anisotropy of the free layer.

29. A method as recited in claim 28, wherein the direction of switching between the two canted states is affected by a magnitude of a voltage applied across the fixed layer and free layer.

30. A method as recited in claim 28, wherein the direction of switching between the two canted states is affected by a width of a voltage pulse applied across the fixed layer and free layer.

31. A method as recited in claim 28, wherein the direction of switching between the two canted states is affected by setting the magnetization into a precessional motion upon application of a voltage pulse having a pulse width timed to affect switching to an opposite stable canted state.

32. A method as recited in claim 28, wherein the free layer comprises an energy barrier configured such that the direction of switching between the two canted states is affected by setting the magnetization into a semi-stable state upon application of a voltage and then achieving switching through thermal activation.

* * * * *